(12) United States Patent
Thorup

(10) Patent No.: US 9,712,131 B2
(45) Date of Patent: Jul. 18, 2017

(54) HIGH ISOLATION POWER COMBINER/SPLITTER AND COUPLER

(71) Applicant: Karl L. Thorup, Taylorsville, UT (US)

(72) Inventor: Karl L. Thorup, Taylorsville, UT (US)

(*) Notice: Subject to any disclaimer, the term of this patent is extended or adjusted under 35 U.S.C. 154(b) by 0 days.

(21) Appl. No.: 14/854,346

(22) Filed: Sep. 15, 2015

(65) Prior Publication Data

US 2017/0077892 A1   Mar. 16, 2017

(51) Int. Cl.
| H01P 5/12 | (2006.01) |
| H03H 7/09 | (2006.01) |
| H03H 7/01 | (2006.01) |

(52) U.S. Cl.
CPC ............ *H03H 7/09* (2013.01); *H03H 7/0123* (2013.01)

(58) Field of Classification Search
CPC .......... H03H 7/09; H03H 7/0123; H01P 5/12; H01P 5/16; H01P 5/19
USPC ........................................ 333/125
See application file for complete search history.

(56) References Cited

U.S. PATENT DOCUMENTS

| 4,401,955 A | 8/1983 | Yorinks et al. |
| 5,977,843 A | 11/1999 | Watanabe |
| 8,130,057 B2 | 3/2012 | Jones et al. |
| 8,289,102 B2 | 10/2012 | Yamamoto et al. |

*Primary Examiner* — Robert Pascal
*Assistant Examiner* — Kimberly Glenn
(74) *Attorney, Agent, or Firm* — Pate Baird, PLLC

(57) ABSTRACT

A power combiner has at least two uncommon ports and at least one common port. Isolation between the uncommon ports over a broad band is achieved through a lossy band response circuit having a phase and amplitude response effective to compensate for changes in phase and amplitude between the uncommon ports with change in frequency of an input signal. The lossy band response circuit may have a resistance approximating a resistance effective to isolate the uncommon ports over a bandwidth at a center frequency. A coupler may likewise increase the band for which an input port is isolated from the isolated port by coupling a lossy circuit between the input port and isolated port. The lossy circuit may be embodied as a lossy band response circuit.

14 Claims, 15 Drawing Sheets

A Three way modified Wilkinson schematic (a Preferred embodiment)

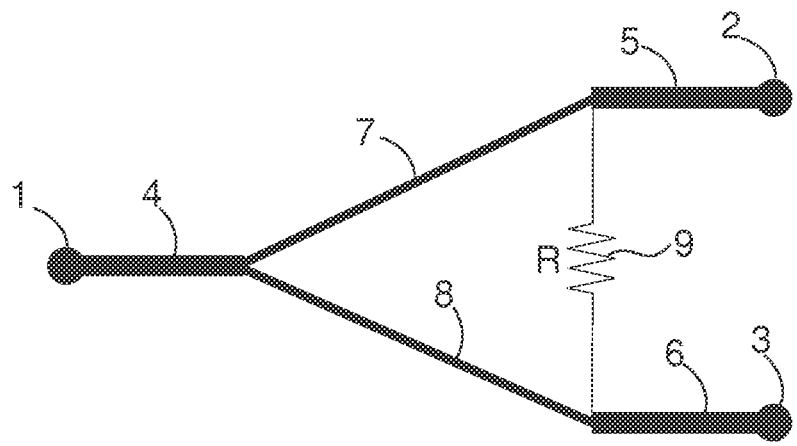
Fig. 1  A One section Wilkinson schematic (Prior Art)
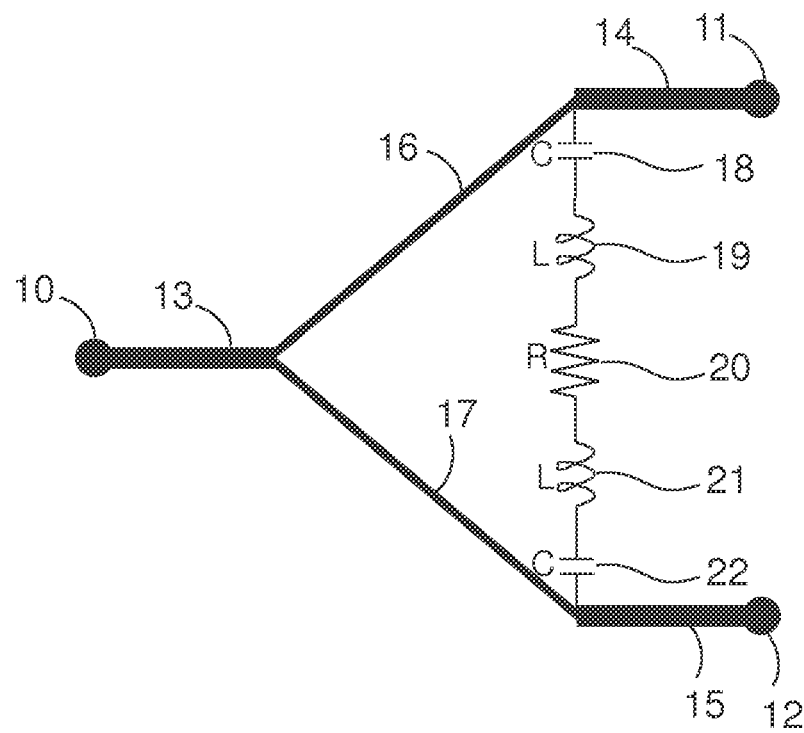
Fig. 2  A One section modified Wilkinson schematic (a Preferred Embodiment)

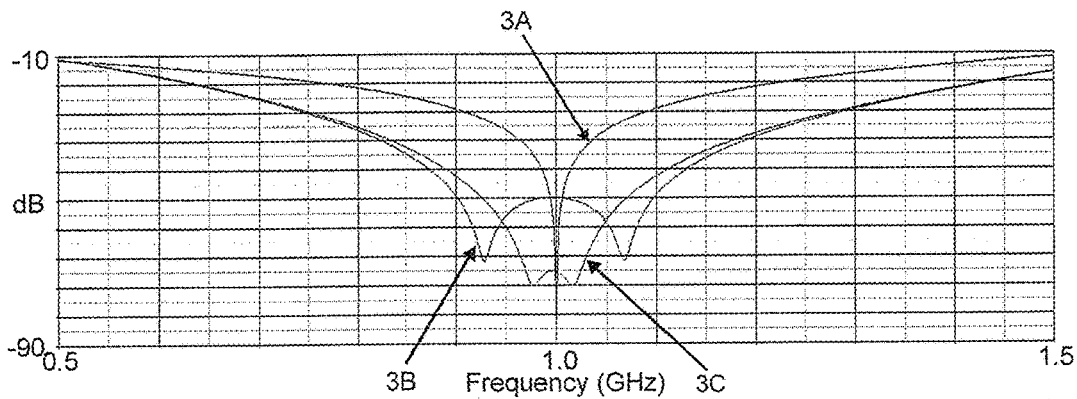
Fig. 3  Graph showing uncommon port to port isolation of a Wilkinson combiner (See Fig. 1) curve 3A, and two different isolations of a preferred embodiment (See Fig. 2) curves 3B and 3C.
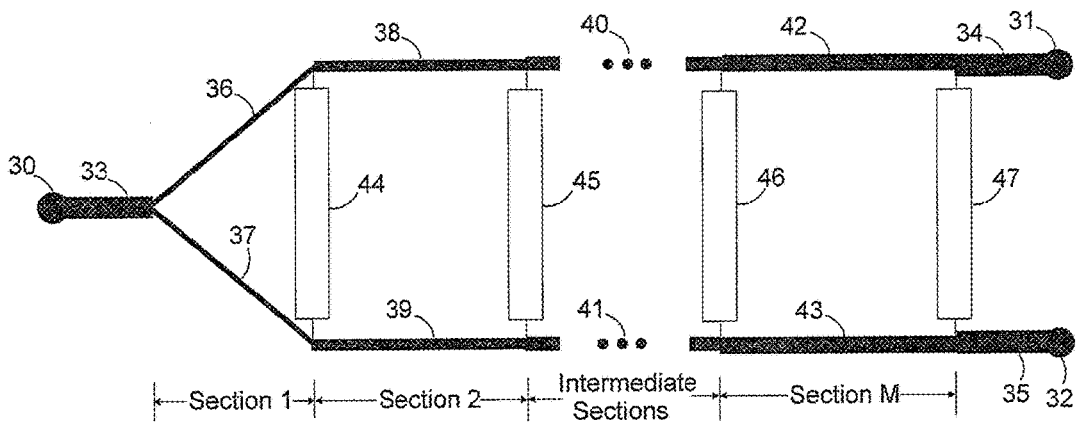
Fig. 4  Schematic showing an M-section combiner/splitter as one of multiple embodiments possible of the present invention

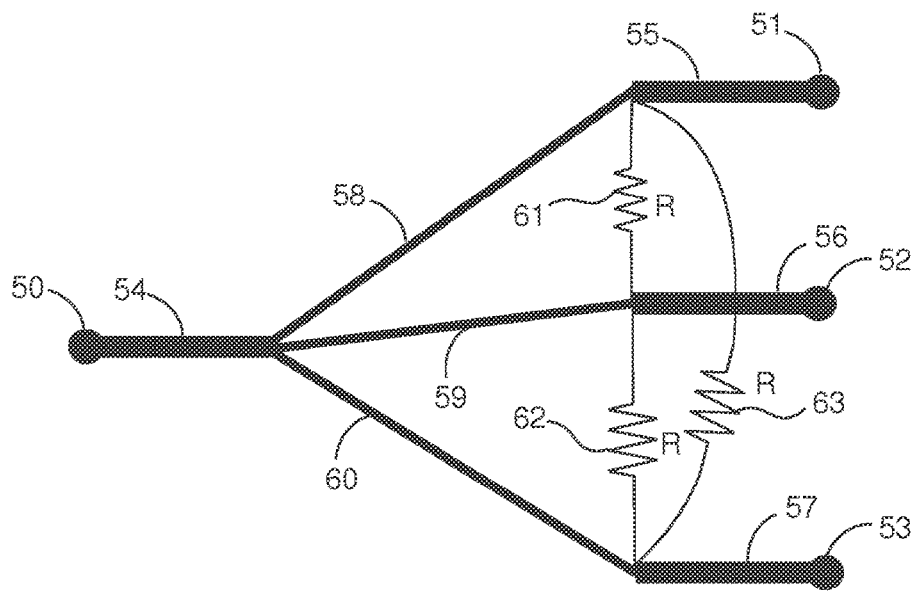
Fig. 5  A Three port Combiner/Splitter schematic (Prior Art)
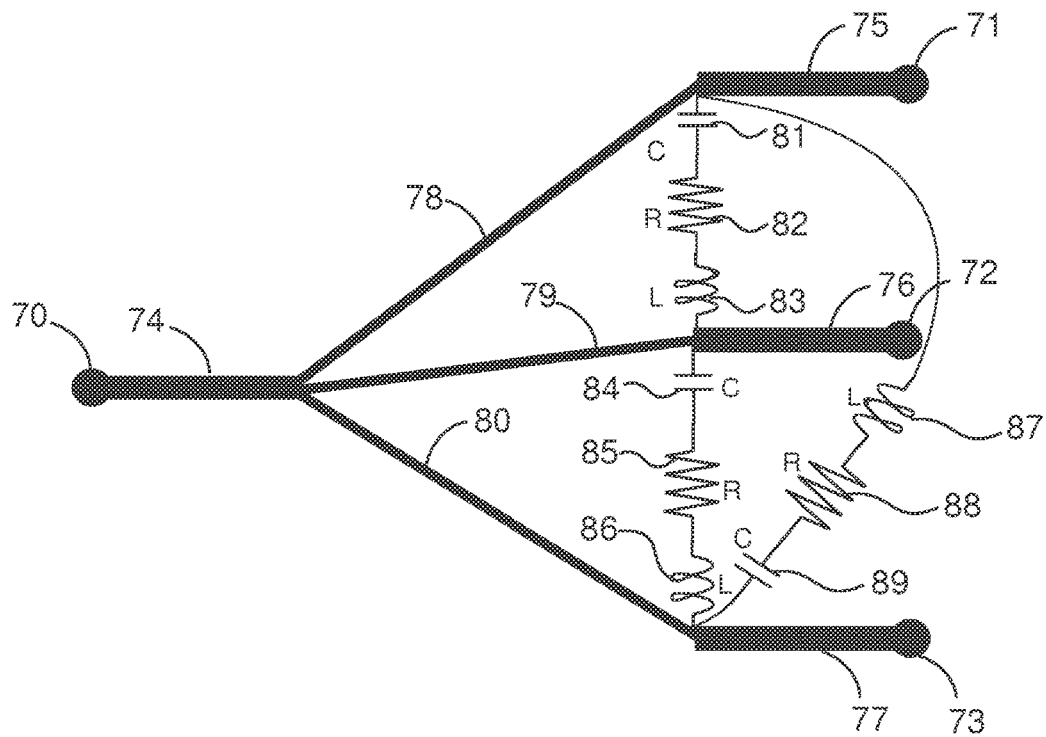
Fig. 6  A Three port Combiner/Splitter schematic (a Preferred Embodiment)

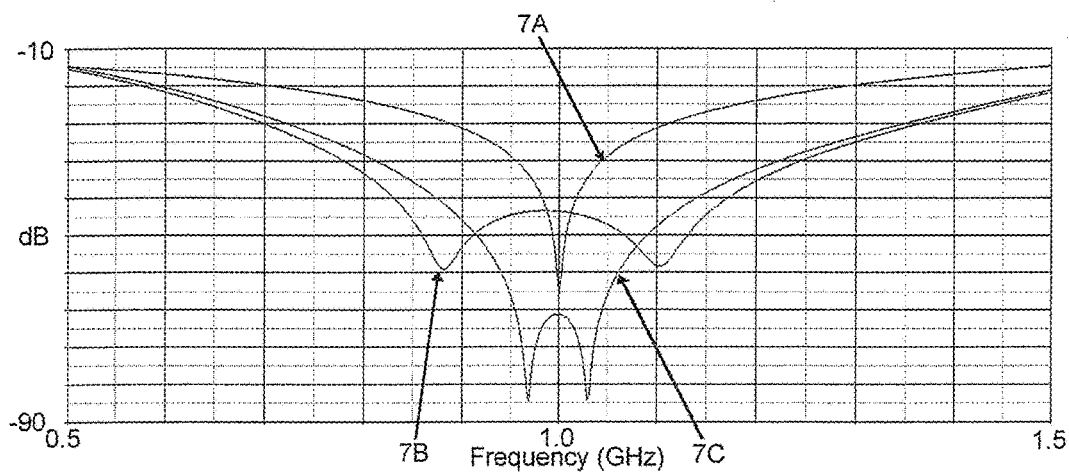
Fig. 7  Graph showing uncommon port to port isolation of a 3 port combiner (See Fig. 5) curve 7A, and two different isolations of a preferred embodiment (See Fig. 6) curves 7B and 7C.
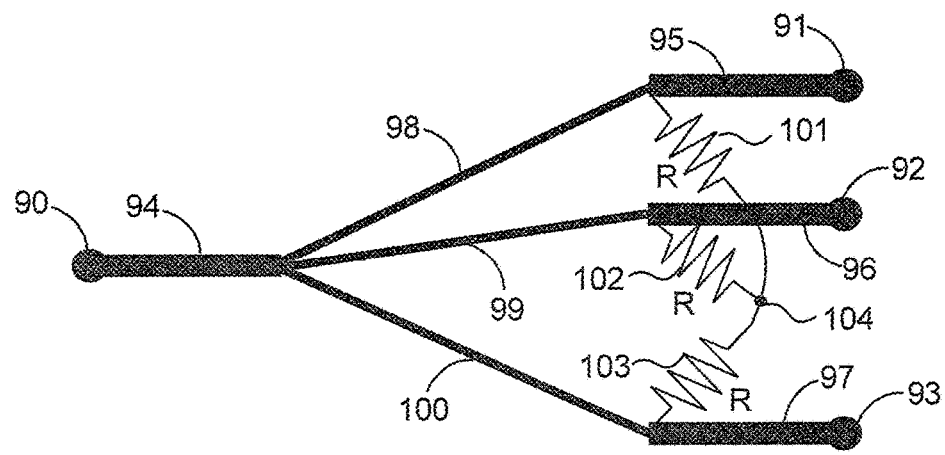
Fig. 8  A Three way Wilkinson schematic (Prior art)

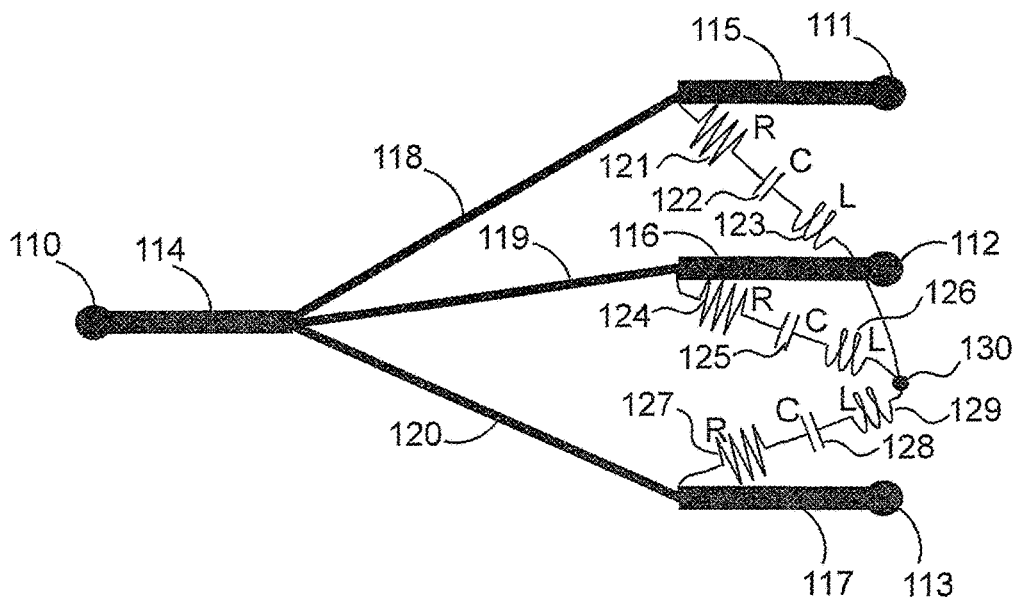
Fig. 9  A Three way modified Wilkinson schematic (a Preferred embodiment)
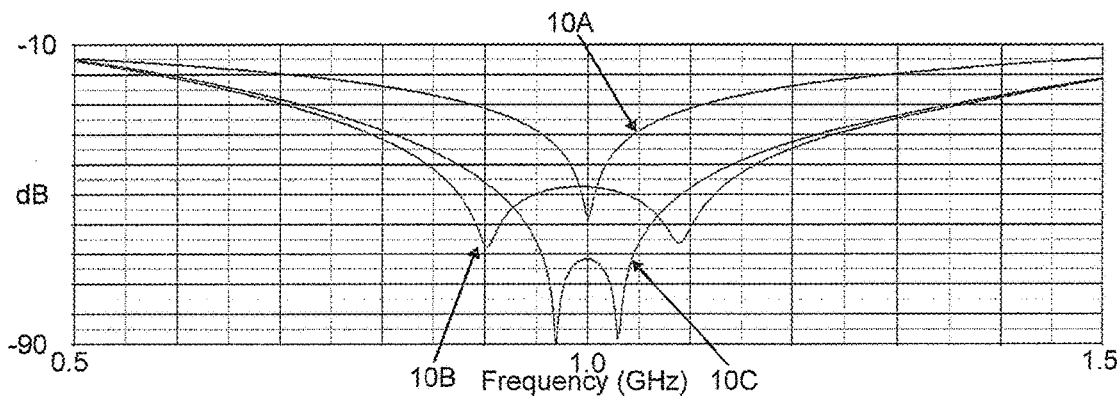
Fig. 10  Graph showing uncommon port to port isolation of a 3 way Wilkinson combiner (See Fig. 8) curve 10A, and two different isolations of a preferred embodiment (See Fig. 9) curves 10B and 10C.

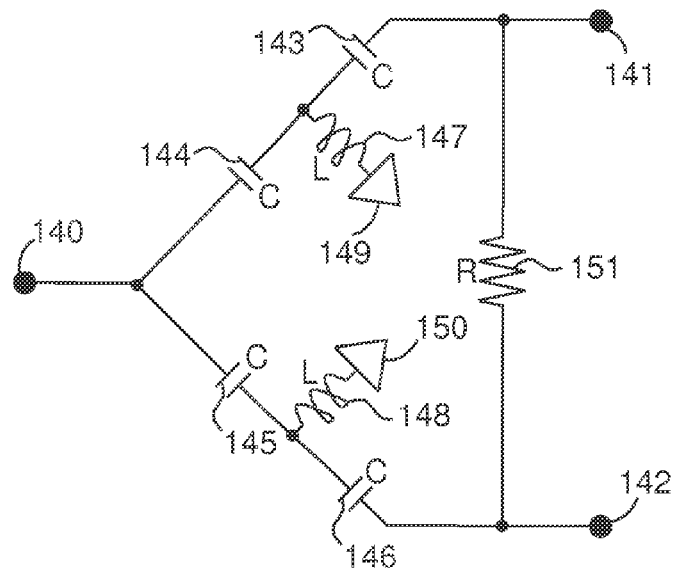
Fig. 11 A Lumped element 'hi pass' combiner schematic (Prior Art)
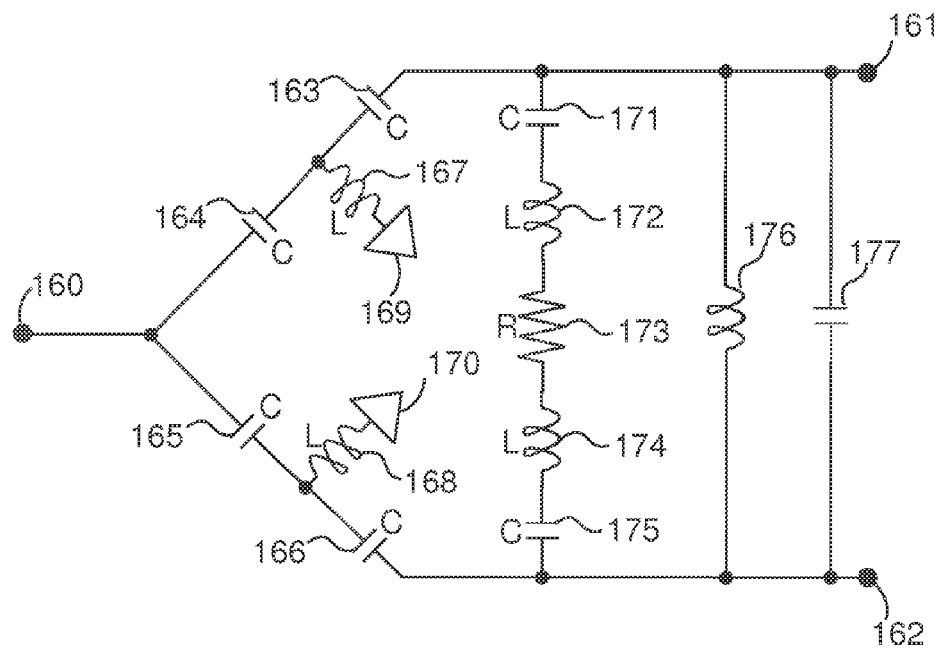
Fig. 12 A Lumped element 'hi pass' combiner schematic (a Preferred Embodiment)

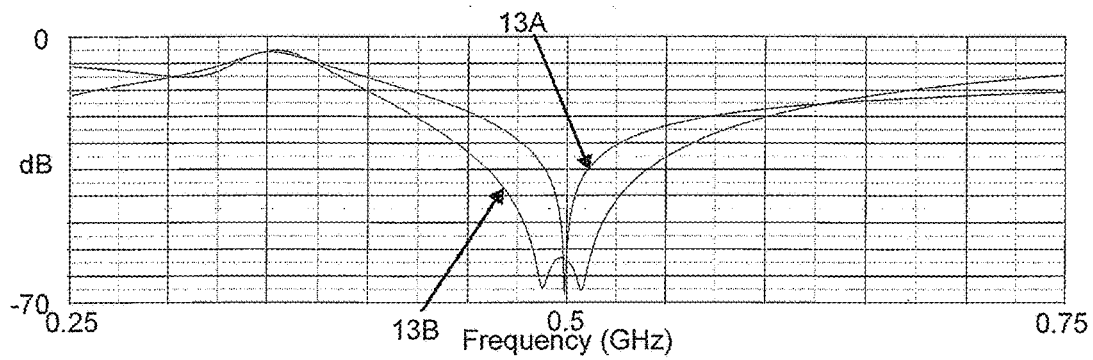
Fig. 13   Graph showing uncommon port to port isolation of a 2 way lumped element 'hi pass' combiner (See Fig. 11) curve 13A, and an isolation of a preferred embodiment (See Fig. 12) curve 13B.
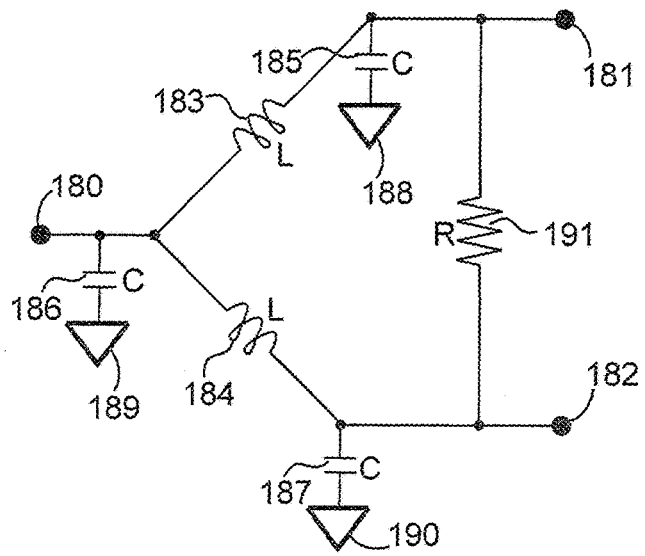
Fig. 14   A Lumped element Wilkinson combiner schematic (Prior Art)

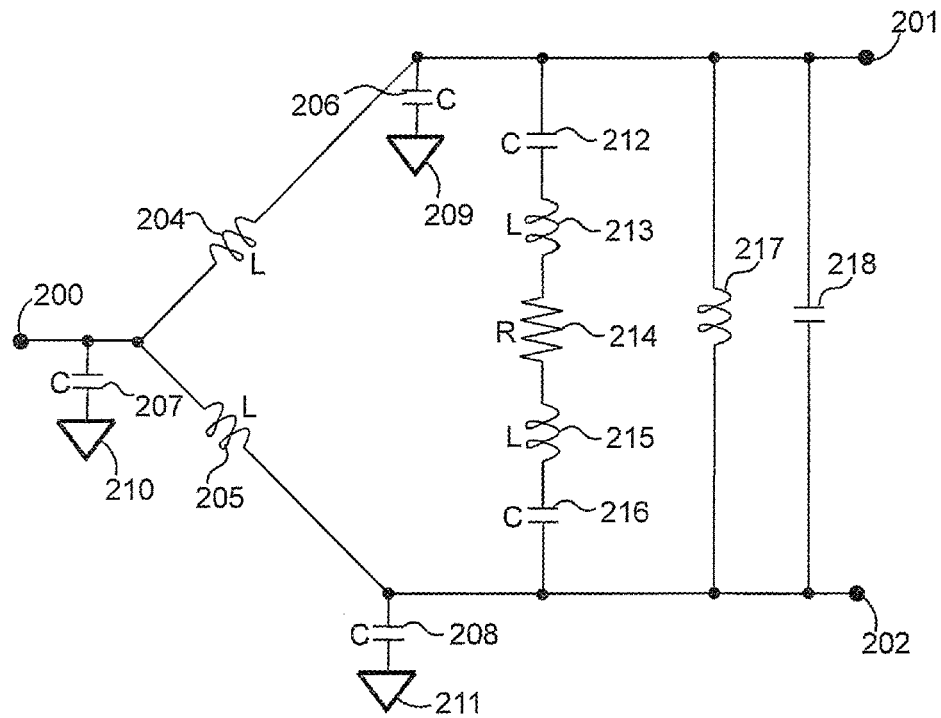
Fig. 15 A modified Lumped element Wilkinson combiner schematic (a Preferred Embodiment)
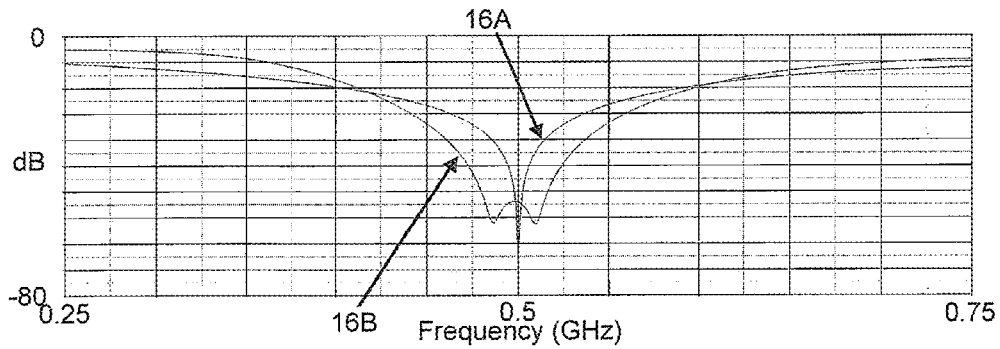
Fig. 16 Graph showing uncommon port to port isolation of a 2 way lumped element 'low pass' combiner (See Fig. 14) curve 16A, and an isolation of a preferred embodiment (See Fig. 15) curve 16B.

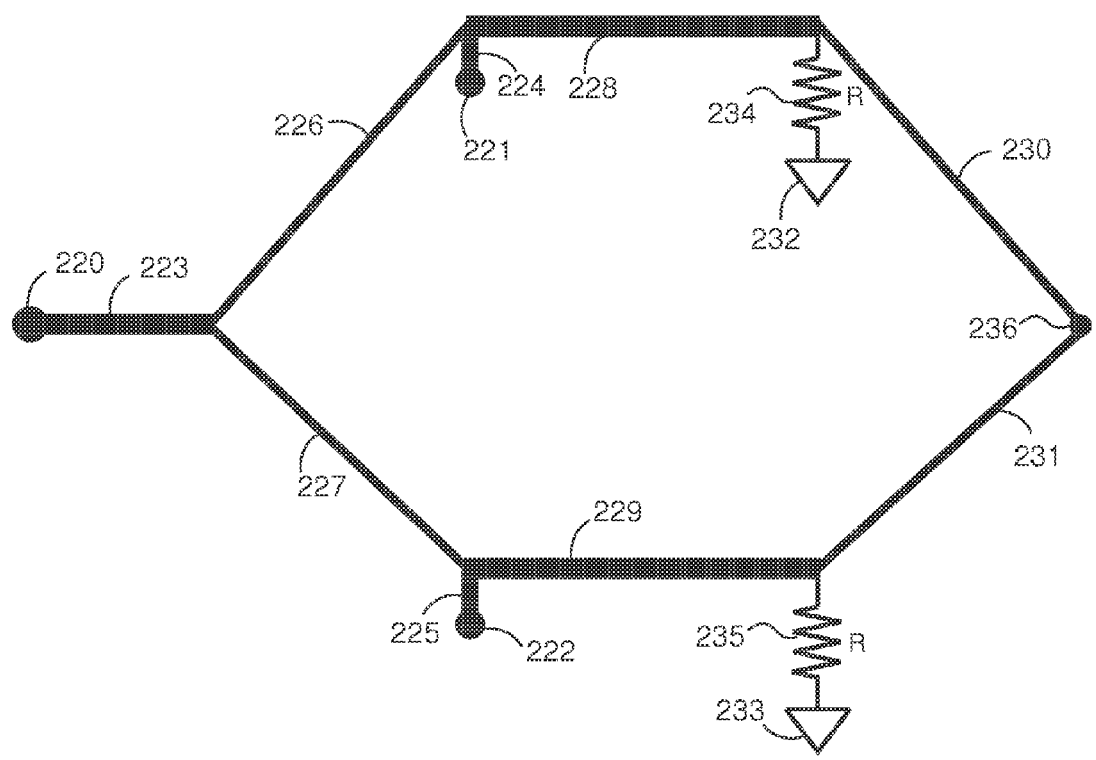
Fig. 17  A Two way Gysel schematic (Prior Art)

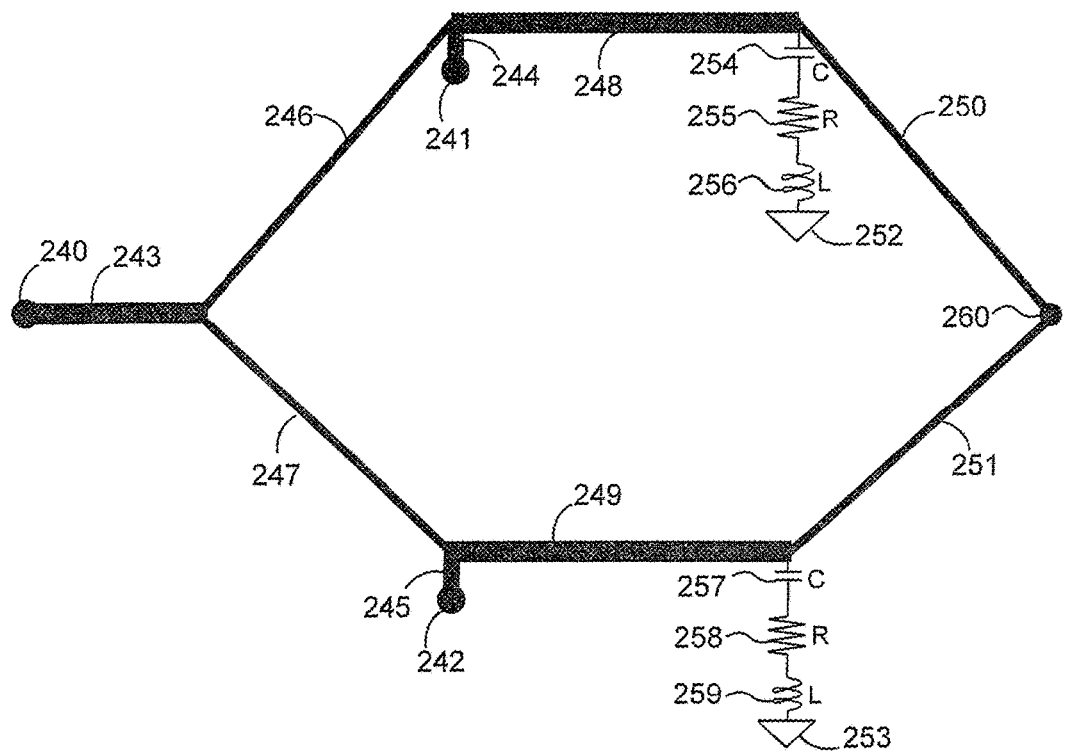
Fig. 18   A Two way modified Gysel schematic (a Preferred Embodiment)
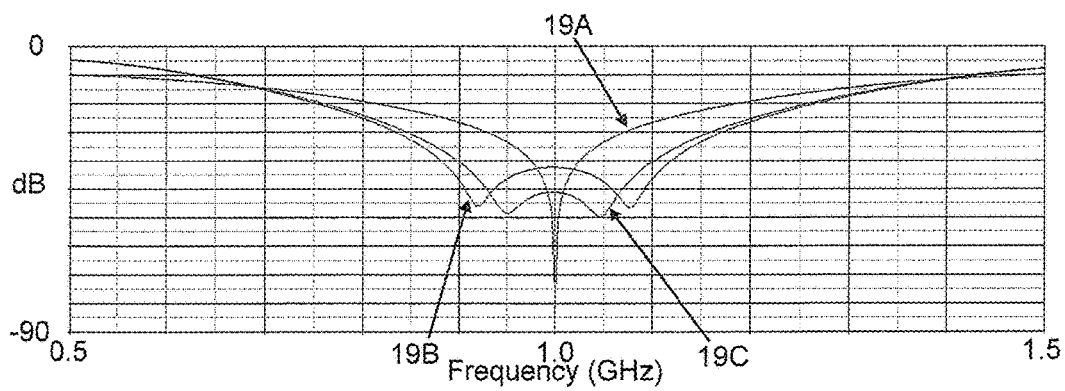
Fig. 19   Graph showing uncommon port to port isolation of a 2 way Gysel combiner (See Fig. 17) curve 19A, and two different isolations of a preferred embodiment (See Fig. 18) curves 19B and 19C.

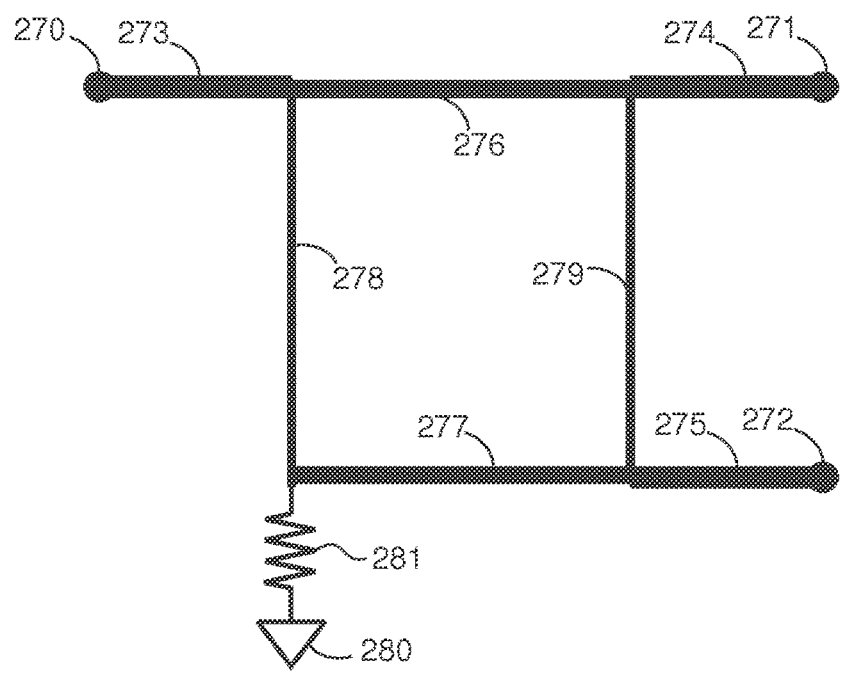
Fig. 20 A Ninety degree Hybrid schematic (Prior Art)
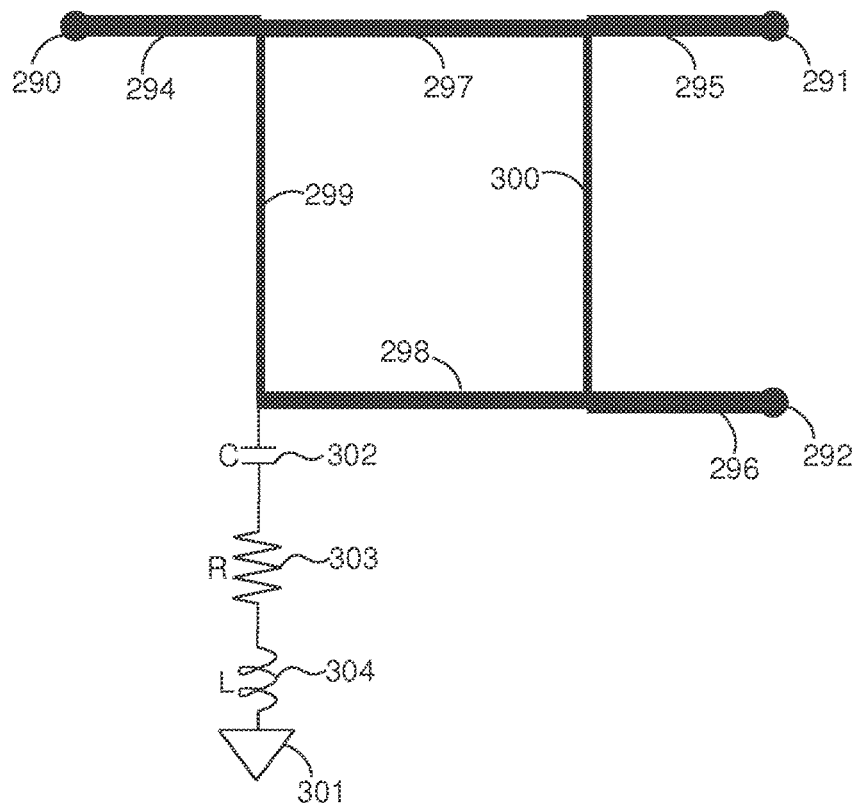
Fig. 21 A Ninety degree Hybrid schematic (Preferred Embodiment)

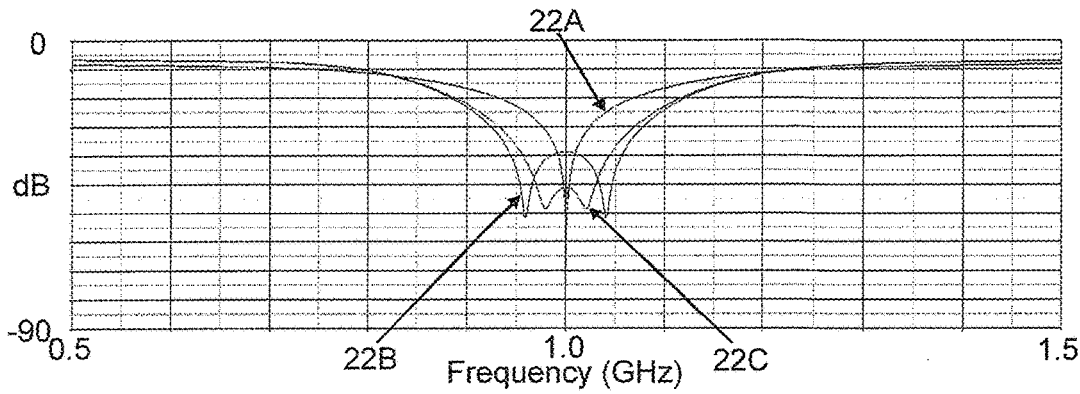
Fig. 22  Graph showing uncommon port to port isolation of a 2 way 90 degree hybrid combiner (See Fig. 20) curve 22A, and two different isolations of a preferred embodiment (See Fig. 21) curves 22B and 22C.
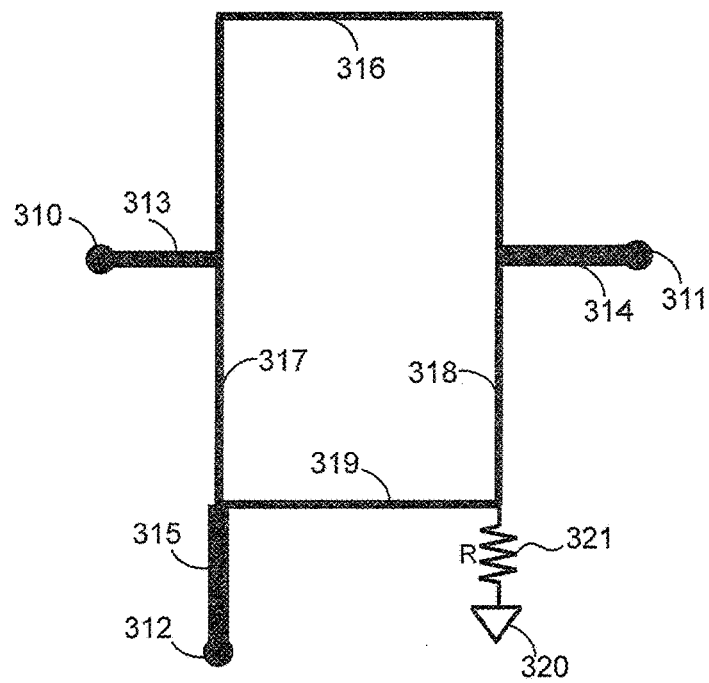
Fig. 23  A 180 Degree combiner schematic (Prior Art)

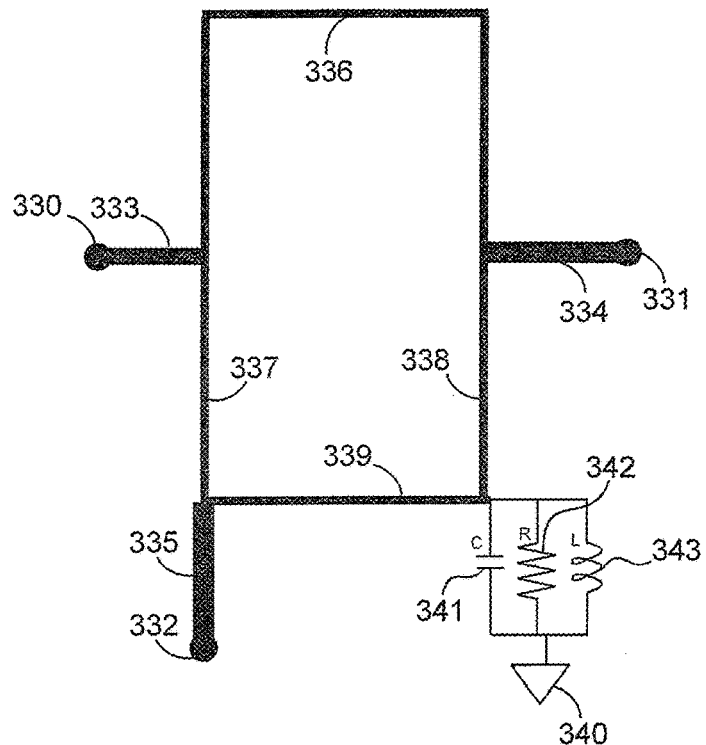
Fig. 24  A modified 180 degree combiner schematic (Preferred Embodiment)
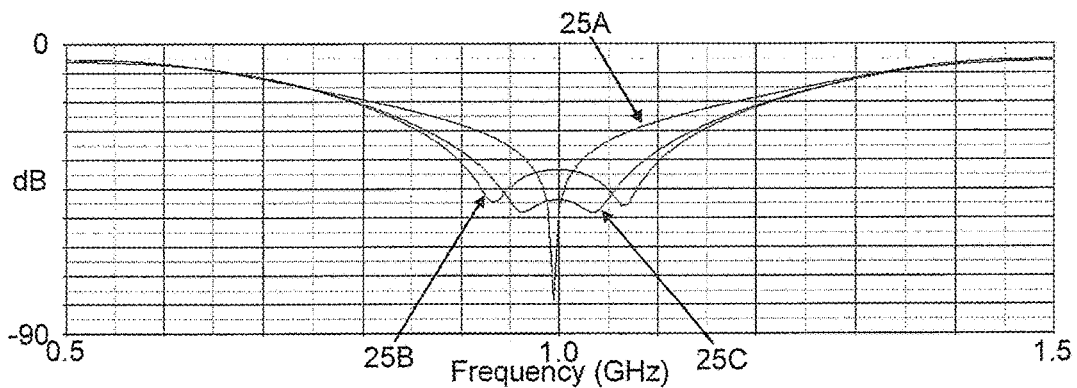
Fig. 25  Graph showing uncommon port to port isolation of a 180 degree combiner (See Fig. 23) curve 25A, and two different isolations of a preferred embodiment (See Fig. 24) curves 25B and 25C.

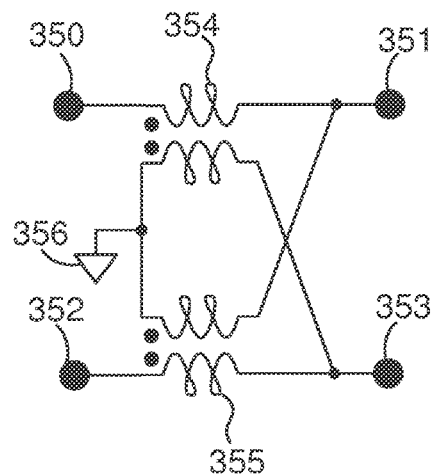
Fig. 26  A Lumped element coupler schematic (Prior Art)
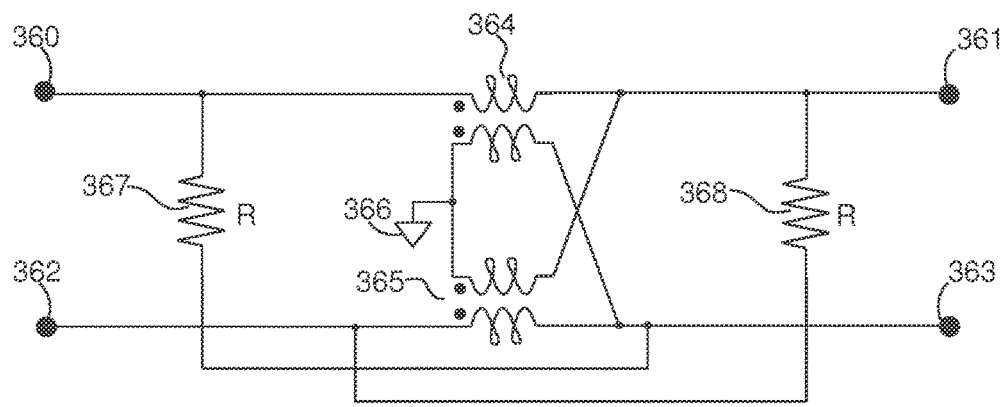
Fig. 27  A Lumped element coupler schematic (A Preferred Embodiment)
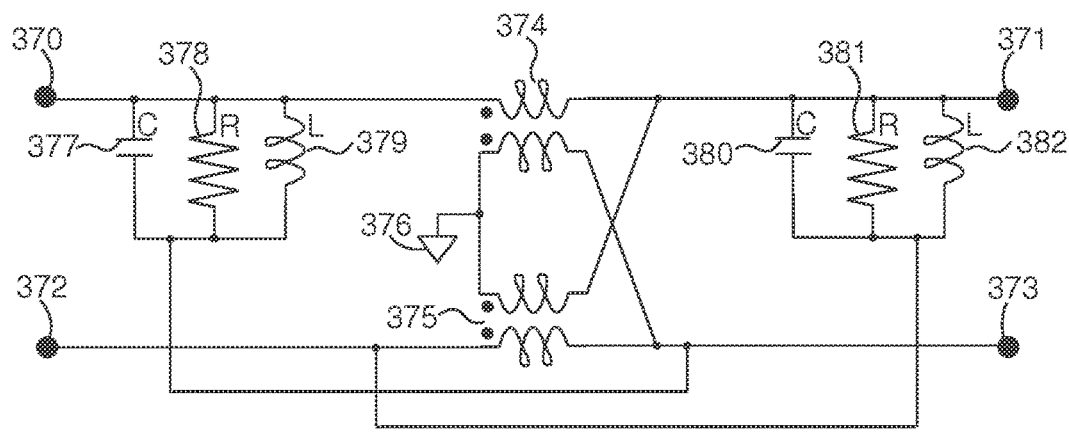
Fig. 28  A Lumped element coupler schematic (A Preferred Embodiment)

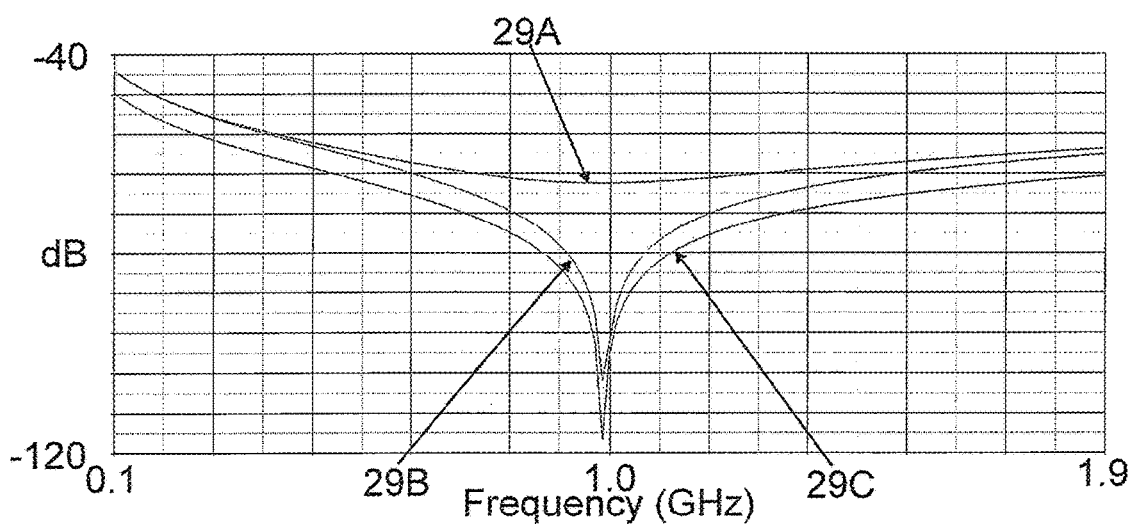
Fig. 29 Graph showing the isolation of a lumped element coupler (See Fig. 26) curve 29A, and two different isolations of a preferred embodiment (See Figs. 27 and 28) curves 29B and 29C.

HIGH ISOLATION POWER COMBINER/SPLITTER AND COUPLER

BACKGROUND

Field of Invention

This invention relates to high isolation power combiners/splitters and couplers, specifically to such combiners/splitters and couplers that are used in RF and microwave circuits.

Description of Prior Art

Special circuits are sometimes required to combine two or more high frequency RF or microwave signals. A commonly used circuit that can accomplish this is called a power combiner. An N-way combiner has one common port and N uncommon ports. The ports are places in the circuit that allow intentional connection to other external circuits. In general, a good power combiner should sum N input signals together with minimal signal energy or power loss. It should also keep the signals that are being summed together isolated from each other at the uncommon inputs. High uncommon port to uncommon port isolation can help to avoid impedance mismatches and signal degradation, and helps to minimize stress to circuitry connected to the uncommon ports.

A power combiner can sometimes be used for the purpose of splitting a single signal into two or more signals. When used in this configuration, the circuit is typically called a power splitter or power divider.

Additionally, sometimes special circuits are used to split signals or sample signals. Couplers, which may be thought of as a special case of a power splitter, are used to couple or sample some RF or microwave signal energy that may be used for various purposes. Often, it is desirable that a coupler have a coupled port and an isolated port, where the isolated port has little or none of the sampled signal, and the coupled port have a specified portion of the sampled signal. Some couplers are used to determine the direction of the sampled signal, whether it flows into the input port, or out of the input port. In these cases, the coupler directivity becomes an important parameter. Directivity is a function of the coupler isolation, again making it desirable for the coupler to have high isolation. In these cases, the coupler is often referred to as a Directional Coupler.

Power Combiners/Splittters

Before the 1960's, power combiner/splitter circuits tried to minimize insertion losses, but did not have significant port to port isolation. Circuits such as the hybrid T and quarter wave matched splitters were common. (U.S. Pat. No. 2,877,427—Butler and U.S. Pat. No. 2,963,664—Yeagly). Other combiner/splitter designs, (U.S. Pat. No. 3,529,265—Podell and 'A New N-way Power Divider/Combiner Suitable for High Power Applications, Proc. Of 1975, IEEE MTT Seminar'—Gysel) demonstrate designs that exhibit isolation between uncommon ports but also are less sensitive to load mismatches and can accommodate high power signals.

U.S. Pat. No. 3,091,743, issued to Wilkinson, disclosed a power combiner/splitter that achieved relatively high port to port isolation between uncommon ports. The isolation was achieved by providing additional signal paths between the uncommon ports through resistors. The portion of a signal traveling through a resistor path had approximately the same amplitude as the signal that traveled to the common port and back to an adjacent uncommon port, but it was approximately 180 degrees out of phase, at the center frequency of design, having a zero degree phase shift at the center frequency of design. This created relatively high isolation between uncommon ports, due to the canceling effect of this circuit topology. For a single section design, however, port to port isolation greater than 40 or 50 dB between the uncommon ports, occurred only in a relatively small frequency bandwidth, on the order of 1 percent. This high isolation occurred at the center frequency of the design.

Cohn published a paper in 1968 (IEEE transactions on Microwave Theory and Techniques, Vol. MTT-16, No. 2, February 1968) where he introduced a multiple section power combiner/splitter. Cohn found that by adding additional quarter wave transmission line sections, plus an additional isolation resistor for each section, that high isolation between uncommon ports may be achieved over a broader bandwidth than a single section. A two section design can achieve up to 50 dB of isolation between uncommon ports over a 20 percent bandwidth, and up to 70 dB in a 5 percent bandwidth. While this design offered a better solution to many systems, this approach has the drawback of requiring additional circuit size due to additional transmission line sections. It also suffers from increased insertion loss, since the signal must travel through longer transmission lines. For many circuits, the relatively large size of a multisection power combiner cannot be tolerated. Additional insertion loss as well, is almost always a drawback in power combiners.

Since 1968, further advances of power combiners/splitters have been accomplished. Some designs exhibit improved power handling capability; others demonstrate decreased circuit size and others improve manufacturability. Some designs incorporate these improvements severally. Advances have also improved or modified electrical parameters of power combiners/splitters such as increased bandwidth, improved input and output VSWR and slightly lower insertion loss. However, to date there has been little improvement on increasing the magnitude of the in-band isolation between uncommon ports.

U.S. Pat. No. 5,489,880, issued to Swarup, discloses a power combiner/splitter that has increased port to port isolation for out-of-band signals. This is achieved by putting band pass filters at the uncommon ports. While this improves the out-of-band port to port isolation, the in-band isolation is not significantly improved. This design also suffers from increased insertion loss over a typical power combiner/splitter due to the signal going through a band pass filter as well as the combiner/splitter circuit.

Some systems require an uncommon port to port isolation that is higher than existing power combiner/splitters can provide. Placing circulators or isolators at uncommon ports, one can achieve isolations greater than 50 dB over relatively large bandwidths. These products, however, are relatively costly and exhibit non-linear characteristics at high input signal levels. They also increase the signal path insertion loss. Furthermore, they are not reciprocal circuits, and cannot be used as splitters without re-orienting the circulators or isolators.

SUMMARY OF THE INVENTION—OR—OBJECTS AND ADVANTAGES

Accordingly, it is an object of the present invention to provide a novel N-way power combiner/splitter and Coupler having the following advantages:
1) Ultra-high isolation of up to 50 dB between uncommon ports of up to 20% bandwidth or more for a single section power combiner/splitter.

2) Ultra-high isolation of up to 70 dB between uncommon ports of up to 5% bandwidth or more for a single section power combiner/splitter.
3) Does not have significant degradation of insertion loss over a standard power combiner/splitter using only resistive elements for isolation.
4) May be constructed using either distributed and lumped-element design techniques or only lumped-element design techniques.
5) Does not exhibit non-linear characteristics for high input signals.
6) Is a reciprocal circuit in that the same configuration can be used for power combining as well as power splitting.

BRIEF DESCRIPTION OF THE DRAWINGS

FIG. 1 illustrates a prior art circuit that is a 2-way Wilkinson power combiner/splitter using distributed transmission lines and a lumped element isolation resistor.

FIG. 2 is a schematic circuit diagram of one embodiment of a 2-way modified Wilkinson power combiner/splitter of the present invention using distributed transmission lines and lumped element isolation components in a lossy band response configuration connected between uncommon ports.

FIG. 3 is a graph showing comparison plots of the uncommon port to uncommon port isolation of a single section Wilkinson power combiner/splitter demonstrating the prior art isolation performance and two implementations of the present invention circuits, which have more uncommon port to uncommon port isolation over a wider bandwidth.

FIG. 4 is a schematic circuit diagram showing some of the multiple embodiments possible of the present invention.

FIG. 5 illustrates a prior art circuit that is a 3-way power combiner/splitter using distributed transmission lines and lumped element isolation resistors, where the lumped element isolation resistors connect between uncommon ports.

FIG. 6 is a schematic circuit diagram of one embodiment of a 3-way power combiner/splitter of the present invention using distributed transmission lines and lumped element isolation components in a lossy band response circuit configuration, connected between uncommon ports.

FIG. 7 is a graph showing comparison plots of the uncommon port to uncommon port isolation of a 3 way power combiner/splitter demonstrating the prior art isolation performance and the advantages of two implementations of the present invention circuits, which have more uncommon port to uncommon port isolation over a wider bandwidth.

FIG. 8 illustrates a prior art circuit that is a 3-way Wilkinson power combiner/splitter using distributed transmission lines and lumped element isolation resistors connected to a common point in the circuit.

FIG. 9 is a schematic circuit diagram of one embodiment of a 3-way modified Wilkinson power combiner/splitter of the present invention using distributed transmission lines and lumped element isolation components in a lossy band response circuit configuration, connected to a common point in the circuit.

FIG. 10 is a graph of comparison plots of the uncommon port to uncommon port isolation of a 3 way Wilkinson power combiner/splitter demonstrating the prior art isolation performance and the advantages of two implementations of the present invention circuits, which have more uncommon port to uncommon port isolation over a wider bandwidth.

FIG. 11 illustrates a prior art circuit that is a 2-way lumped element power combiner/splitter using lumped elements having a high pass configuration and a lumped element isolation resistor connected between uncommon ports.

FIG. 12 is a schematic circuit diagram of one embodiment of a 2-way modified lumped element power combiner/splitter of the present invention using lumped elements having a high pass configuration and lumped element isolation components in a lossy band response circuit configuration connected between uncommon ports.

FIG. 13 is a graph of comparison plots of the uncommon port to uncommon port isolation of a 2 way lumped element power combiner/splitter having a high pass configuration demonstrating the prior art isolation performance and the advantages of one implementation of the present invention circuits, which has more uncommon port to uncommon port isolation over a wider bandwidth.

FIG. 14 illustrates a prior art circuit that is a 2-way lumped element power combiner/splitter using lumped elements having a low pass configuration and a lumped element isolation resistor connected between uncommon ports.

FIG. 15 is a schematic circuit diagram of one embodiment of a 2-way modified lumped element power combiner/splitter of the present invention using lumped elements having a low pass configuration and lumped element isolation components in a lossy band response circuit configuration, connected between uncommon ports.

FIG. 16 is a graph showing a comparison plot of the uncommon port to uncommon port isolation for a 2 way lumped element power combiner/splitter using a low pass configuration demonstrating the prior art and the advantages of one implementation of the present invention circuits, which has more uncommon port to uncommon port isolation over a wider bandwidth.

FIG. 17 illustrates a prior art circuit that is a 2-way Gysel power combiner/splitter using distributed transmission lines and lumped element isolation resistors, connected between a point within the circuit and circuit return or ground.

FIG. 18 is a schematic circuit diagram of one embodiment of a 2-way modified Gysel power combiner/splitter of the present invention using distributed transmission lines and lumped element isolation components in a lossy band response circuit configuration connected between a point within the circuit and circuit return or ground.

FIG. 19 is a graph showing a comparison plot of the uncommon port to uncommon port isolation for a 2-way Gysel power combiner/splitter demonstrating the prior art and the advantages of two implementations of the present invention circuits, which have more uncommon port to uncommon port isolation over a wider bandwidth.

FIG. 20 illustrates a prior art circuit that is a 2-way ninety degree power combiner/splitter hybrid using distributed transmission lines and lumped element isolation resistor, connected between a point in the circuit and circuit return, or ground.

FIG. 21 is a schematic circuit diagram of one embodiment of a 2-way modified ninety degree power combiner/splitter hybrid of the present invention using distributed transmission lines and lumped element isolation components in a lossy band response circuit configuration connected between a point in the circuit and circuit return or ground.

FIG. 22 is a comparison plot of the uncommon port to uncommon port isolation for a 2-way ninety degree power combiner/splitter demonstrating the prior art and the advantages of two implementations of the present invention circuits, which have more uncommon port to uncommon port isolation over a wider bandwidth.

FIG. 23 illustrates a prior art circuit that is a 2-way 180 degree power combiner/splitter hybrid using distributed transmission lines and a lumped element isolation resistor, connected between a point in the circuit and circuit return or ground.

FIG. 24 is a schematic circuit diagram of one embodiment of a 2-way modified 180 degree power combiner/splitter hybrid of the present invention using distributed transmission lines and lumped element isolation components in a lossy band response configuration, connected between strategic locations in the circuit and circuit return or ground.

FIG. 25 is a graph showing a comparison plot of the uncommon port to uncommon port isolation for a 2-way 180 degree hybrid power combiner/splitter demonstrating the prior art and the advantages of two implementations of the present invention circuits, which have more uncommon port to uncommon port isolation over a wider bandwidth.

FIG. 26 illustrates a prior art circuit that is a lumped element coupler using two lumped element transformers.

FIG. 27 is a schematic circuit diagram of one embodiment of a modified lumped element coupler of the present invention using two lumped element transformers and two lumped element resistors connected between ports that are desired to be isolated.

FIG. 28 is a schematic circuit diagram of one embodiment of a modified lumped element coupler of the present invention using two lumped element transformers and two lumped element lossy band response circuits, connected between ports that are desired to be isolated.

FIG. 29 is a graph of comparison plots of the input port to isolated port isolation for a lumped element coupler demonstrating the prior art and the advantages of two implementations of the present invention circuits, which have more isolation between the input ports and the isolated ports, over a wider bandwidth.

DETAILED DESCRIPTION

For purposes of this disclosure, the transmission line schematic symbols throughout all the figures represent both the signal carrying conductor and the return path or ground path conductor, such as is consistent for coaxial cable, coplanar, stripline or microstripline transmission lines or other transmission line structures. Additionally, the schematic elements portrayed as capacitances, inductances and resistances may be considered to be lumped elements, and may be elements etched on a circuit board or may be separate parts connected to the circuit board, or some other construction, such as integrated circuit implementations.

For purposes of this disclosure "coupling" and "coupler" may refer to any circuit providing at least one path between a port and one or more other ports either through a conductor, magnetic coupling, or electric field coupling or some combination of the three.

For purposes of this disclosure an electrical isolation provided over a "greater" bandwidth relative to isolation provided by a passive resistance in a prior art design is an electrical isolation that is over a bandwidth that is at least 10 percent wider at an isolation of at least −20 dB. In some embodiments, an electrical isolation provided over a "greater" bandwidth relative to isolation provided by a passive resistance in a prior art design is an electrical isolation that is over a bandwidth that is at least 10 percent wider at an isolation of at least −30 dB. In other embodiments, an electrical isolation provided over a "greater" bandwidth relative to isolation provided by a passive resistance in a prior art design is an electrical isolation that is over a bandwidth that is at least 10 percent wider at an isolation of at least −50 dB.

For purposes of this disclosure, approximately 180 degrees is defined as a delta phase shift between a phase of a first signal and a phase of a second signal that is equal to 180 degree+/−10 degrees or at least a 20 dB reduction in a sum of the first and second signals.

For purposes of this disclosure, approximately equal amplitude is defined as amplitudes differing by no more than 2 dB. Stated differently, approximately equal amplitude for first and second signals may be defined as a difference in amplitude between the first and second signals such that when a phase of a first signal and a phase of a second signal are 180 degree out of phase there will be at least a 20 dB reduction in a sum of the first and second signals relative to the amplitude of at least one of the first and second signals.

Referring to FIG. 1, a Wilkinson combiner/splitter includes common port 1 and uncommon ports 2 and 3; each connected to a transmission line 4, 5, and 6, respectively, having a characteristic impedance of Z ohms, and may be electrically short. Transmission lines 5 and 6 are coupled or connected to transmission line 4 by quarter wave transmission lines 7 and 8 and by a resistor 9. Transmission lines 7 and 8 have a characteristic impedance of Z*sqrt(3) ohms. Resistor 9 has a resistance of Z*2 ohms.

In the embodiment of FIG. 2, a power combiner comprises three transmission lines 13, 14, 15, which may have any electrical length, but may be as short as possible. The transmission lines 13, 14, 15, have a characteristic impedance Z ohms, which may be 50 Ohms. These three input or output lines 13, 14, 15, which may have a similar impedance Z ohms, connect to the circuit and to ports 10, 11, 12, respectively. The circuit is also comprised of two transmission lines 16, 17, each having a characteristic impedance that may be Z*sqrt(2) ohms, e.g. 70.7 Ohms for Z=50 ohms. The lengths of transmission lines 16, 17 may be approximately a quarter wavelength at the design center frequency and join together to a common transmission line 13. The two uncommon ends of the transmission lines 16, 17 each connect to a different one of the transmission lines 14, 15 and have a lossy band response circuit connected between them.

In the illustrated embodiment, the lossy band response circuit includes two capacitors 18, 22, a resistor 20, and two inductors 19, 21, hereinafter referred to as a 'lossy band response circuit'. In general, a 'lossy band response circuit' may be defined as an amplitude and phase modifying circuit comprised of any series resonant circuit, parallel resonant circuit, or some combination of the two types of circuits, single order or multiple order, that are comprised of lumped element components that incorporate some intentional resistance, i.e. a resistance that may include any parasitic resistance of the reactive elements, but also includes additional added resistance that is substantially greater than that parasitic resistance. Specifically, for purposes of this disclosure a resistance that is substantially greater than a parasitic resistance is one that is at least 100 times greater than the parasitic resistance. For purposes of this disclosure a lossy band response circuit may be configured as a band pass circuit or as a band reject circuit or some combination of the two circuit types. As used herein a lossy band response circuit is designed to be at a center frequency equal to, or approximately equal to (e.g. within 15%, preferably 5%), the center frequency and/or design frequency of the circuit in which it is placed and may have useful operation over the some portion of the bandwidth of the combiner. It may be that one lumped component might incorporate two or more of the reactances required to achieve the desired resonant circuit, (e.g. one inductor with intentional high losses may be used in lieu of a separate low loss inductor and a resistor) or that each reactance is individually achieved with separate lumped element components.

The energy from a signal injected into port 11 will split into two signals within the circuit, each having a portion of the original energy and will arrive at port 12 via two different paths. One path is through transmission lines 16 and 17, while the other path is through the lossy band response circuit (lumped elements 18 through 22). The following are three possible scenarios that can occur with such a condition.

Scenario 1:

In the embodiment illustrated, the portion of the signal applied at port 11 that goes through transmission lines 16 and 17, at the combiner center frequency and then arrives at port 12, experiences a phase shift of approximately one half a wavelength, or 180 degrees. The portion of the signal that goes through the lossy band response circuit (lumped elements 18 through 22), has little or no phase shift due to the nature of the lossy band response circuit at the combiner center frequency. The amplitudes of both signals that travelled different paths are nearly the same. At port 12, the two portions of the original signal 'add' together. Two summed signals of nearly equal amplitude but nearly 180 degrees out of phase, sum to zero amplitude, or very close to zero. Therefore, at the center frequency of design, a signal injected into port 11 will appear at port 12 having very small voltage amplitude. This is how high uncommon port to uncommon isolation is achieved. This explanation, only at the center frequency of design, also applies to the prior-art Wilkinson power combiner shown in FIG. 1.

Scenario 2:

At frequencies slightly above (e.g. 1% or more) the combiner center design frequency, the portion of the signal applied to port 11 traveling through transmission lines 16 and 17 experiences a phase shift greater than 180 degrees. However, the portion of the signal that travels through the lossy band response circuit (lumped elements 18-22) receives a phase shift greater than 0 degrees, making the delta phase shift still close to 180 degrees between portions of the signals that travel the different paths but both arrive and sum at port 12. The amplitudes of the signals through each path are still nearly the same. Thus, a signal injected into port 11 that is slightly above the center design frequency will also nearly cancel at port 12, resulting in a relatively small amplitude at port 12, which gives a relatively high uncommon port to uncommon port isolation in the circuit.

Scenario 3

At frequencies slightly below (e.g. 1% or more) the combiner center design frequency, the portion of the signal applied to port 11 and traveling through transmission lines 16 and 17 experiences a phase shift less than 180 degrees. The portion of the signal that travels through the lossy band response filter (lumped elements 18-22) receives a phase shift less than 0 degrees, making the delta phase shift still close to 180 degrees between portions of the signals that travel the different paths but both arrive and sum at port 12. The amplitudes of the signals through each path are nearly the same. Thus, a signal injected into port 11 that is slightly below the center design frequency will also nearly cancel, resulting in a relatively small voltage amplitude at port 12, which gives a relatively high uncommon port to uncommon port isolation in the circuit.

The exact values of the lumped elements 18-22 depend on what uncommon port to uncommon port isolation bandwidth is desired. For example, if it is desired to have an isolation of 50 dB over approximately a 20% bandwidth, for a design centered at 1 GHz designed for 50 ohms, then inductors 19 and 21 should have a reactance of approximately $Z*1.08$ ohms, reactive, or 54.42 Ohms. Resistor 20 should be approximately $Z*1.97$ ohms or 98.79 Ohms, and capacitors 18 and 22 should be approximately $Z*1.08$ ohms, reactive, or 54.16 Ohms. These values may need to be slightly adjusted for different designs, which will result in slightly different isolation values over the desired bandwidth. Other impedance combinations may be found as well to achieve 50 dB of isolation over nearly a 20% bandwidth. If, on the other hand, it is desired to achieve an isolation of 70 dB over a 5% bandwidth, then the following impedances should be achieved. Inductors 19, 21 should have a reactive impedance of $Z*1.09$ ohms, reactive, or 54.43 Ohms. Resistor 20 should be $Z*1.997$ ohms, or 99.85 Ohms for, and capacitors 18, 22 should have a reactive impedance of $Z*1.09$ ohms, reactive, or 54.41 Ohms, to achieve that isolation. Again, other impedances may be found that achieve 70 dB of isolation over nearly a 5% bandwidth.

Note that the resistance of resistor 20 has a slightly different value from the standard 100 Ohms that a Wilkinson power combiner requires in a Z=50 ohm design. This different resistance value from the prior art implementation is common in the many implementations of the present invention. The resistance portion of the lossy band response circuit is designed or tuned to be a slightly different value than the standard value used in each of the prior art circuits, and may be slightly higher in resistance or more commonly, slightly lower in resistance. In addition, note that while the reactance impedances may vary a little for different isolation bandwidths, the resistance change is a dominant factor in realizing different isolation bandwidths.

For purposes of this disclosure the definition of "slightly" different than a nominal resistance value (100 Ohms, in the example above) may be interpreted as different from the nominal value by between 0.01 percent and 25 percent. For the embodiments disclosed herein, increases in the difference between the resistance portion of the lossy band response circuit and the nominal resistance value of an analogous conventional circuit will generally result in broadening of the isolation band response of the combiner, coupler, or other device in which it is incorporated. However, the degree of isolation will generally decrease with increasing the difference between the resistance of the resistance portion and the nominal resistance value.

For a single section power combiner, the amplitude and phase matching circuit is defined as follows. It is a circuit that has nearly the same amplitude response, in a desired bandwidth, from an uncommon port to an adjacent uncommon port, as the amplitude response the transmission line path has between the same two uncommon ports. The amplitude and phase matching network also has a phase response that is nearly 180 degrees out of phase, in the same desired bandwidth, with the transmission line path phase response. Therefore an amplitude and phase matched network allows high isolation between uncommon ports to occur.

If the resistor 9 in FIG. 1 only is used to provide isolation from port 2 to port 3, which is the configuration described by Wilkinson, the phase shift through the resistor 9 should be about 0 degrees, independent of frequency. Even though the signal amplitudes through the two paths (through transmission lines 7, 8 and the resistor path 9) may be the same over some bandwidth, the phase difference is 180 degrees only at one frequency, or over a small bandwidth, so that high isolations of greater than 50 dB can occur only over a small bandwidth of about 1%, centered at the design center frequency, as shown by line 3A of FIG. 3.

The embodiment of FIG. 2 just described does not exhibit significant increase in insertion loss over a typical Wilkinson combiner. The added components, including the inductors 19, 21 and capacitors 18, 22, may be mostly reactive with small resistive losses and do not dissipate significant energy.

FIG. 3 shows a graph of the combiner uncommon port to uncommon port isolation in dB from port 11 to port 12 in FIG. 2, for a 50 dB design as well as a 70 dB design, both of the present invention, compared with the standard isolation of a Wilkinson combiner (prior art), between uncommon ports 2 and 3 as shown in FIG. 1. Line 3A is the uncommon port to uncommon port isolation of a standard Wilkinson power combiner in dB. Line 3B is the uncommon port to port isolation in dB of an implementation of the embodiment of FIG. 2, showing approximately 50 dB isolation over nearly a 20% bandwidth. Line 3C is the uncommon port to uncommon port isolation in dB of another implementation of the circuit of FIG. 2, showing approximately 70 dB isolation over nearly a 5% bandwidth.

The embodiment shown in FIG. 2 may be extended to include additional lumped element components, increasing the circuit order between ports 11 and 12 to increase the isolation bandwidth as well as the operational bandwidth of the power combiner/splitter.

The embodiment shown in FIG. 2 may also be modified to include additional quarter wave transmission line sections, such as is revealed by Cohn, to extend the bandwidth of the combiner/splitter even more. Each additional section would consist of two approximately quarter wave transmission lines as Cohn has shown in the previous art, but replacing each section's isolation resistor with a band response amplitude and phase matching circuit as described herein, i.e. a lossy band response circuit.

Referring to FIG. 4, for an M-section combiner/splitter, an amplitude and phase matching circuit is defined as having the required phase and amplitude response to cause a signal injected into one uncommon port to be canceled at another uncommon port. In an M-section combiner/splitter, M lossy band response circuits may be used, separated by approximately quarter-wave transmission line sections, (each section having impedances as are required for an M section broadband Wilkinson combiner) and that provide high uncommon port to uncommon port isolation. With a two-section power combiner, for example, 50 dB of isolation may be achieved over approximately a 100% (octave) bandwidth. 70 dB of isolation may be achieved over approximately a 20% bandwidth.

It should be noted that all combiner/splitter designs may not require that the amplitude and phase matching circuit be symmetrical with respect to each uncommon port between which it is connected, as shown in FIG. 2. Combiners designed for relatively low frequencies may use lossy band response circuits that are not symmetrical between uncommon ports, with little degradation of the output power(s). In addition, combiners that do not require an even or equal split or combine ratio may also use an asymmetrical lossy band response circuit design such as one inductor in series with one resistor in series with one capacitor. Also, the arrangement of the components may not be important. For example, resistors could be connected directly to the uncommon ports rather than the capacitors, and the inductor could be in the middle of the lossy band response circuit.

As referenced earlier, FIG. 4 is a general diagram showing that it is possible to extend the embodiments of the present invention to include more than one section of approximately quarter wavelength transmission lines. In doing so, the useful bandwidth of the power combiner can increase and the uncommon port to uncommon port isolation can increase over bandwidth. FIG. 4 also points out that the lossy band response circuits can be comprised of a simple RLC components, or can be made to be a several order circuit, both with series components and shunt (to circuit return) components.

FIG. 5 shows prior art of a three-way combiner/splitter. Input/output ports are common port 50 and uncommon ports 51, 52 and 53 that are connected to transmission lines 54, 55, 56, 57, respectively, having characteristic impedance Z ohms. Transmission lines 55, 56, 57 are connected to transmission line 54 through quarter-wavelength transmission lines 58, 59, 60, respectively, each of the three transmission lines having a characteristic impedance of Z*sqrt(3) ohms. Resistor 61 connects between transmission line 55 and transmission line 56, resistor 62 connects between transmission line 56 and transmission line 57, and resistor 63 connects between transmission line 57 and transmission line 55. The resistors 61, 62 and 63 may have resistance Z*3.08 ohms.

FIG. 6 shows an embodiment of a three-way power combiner/splitter in accordance with an embodiment of the present invention, where again, the resistances 61, 62, 63 called for in the prior art circuit of FIG. 5, are replaced with lumped element lossy band response circuits, comprised of components 81-83, 84-86, and 87-89, respectively, as shown in FIG. 6.

The circuit of FIG. 6 includes common port 70 and uncommon ports 71-73 connected to transmission lines 74-77, respectively, having characteristic impedance Z ohms. Transmission lines 75-77 are connected to transmission line 74 through quarter-wavelength transmission lines 78-80, respectively. The characteristic impedance of the quarter-wavelength transmission lines 78-80 may be Z*sqrt(3) ohms. In a 50 ohm system, capacitors 81, 84 and 87 may be Z*3.6 ohms, reactive, or 182.9 ohms. Inductors 83, 86 and 87 may be Z*3.8 ohms, reactive, or 188.5 ohms. The values of the resistors 82, 85, 88 may be Z*2.84 ohms, or 142 Ohms.

FIG. 7 shows a graph of the combiner uncommon port to uncommon port isolation in dB from port 71 to port 72 in FIG. 6, for a 43 dB design (line 7B) as well as a 66 dB design (line 7C), both of the present invention, compared with the standard port to port isolation (line 7A) of a three-way prior art combiner, between uncommon ports 51 and 52 as shown in FIG. 5. Line 7A is the uncommon port to uncommon port isolation of a standard 3 way prior art power combiner in dB (see FIG. 5). Line 7B is the uncommon port to uncommon port isolation in dB of the embodiment of FIG. 6, showing approximately 43 dB isolation over nearly a 32% bandwidth. Line 7C is the uncommon port to uncommon port isolation in dB of an embodiment of FIG. 6, showing approximately 66 dB isolation over nearly an 8% bandwidth.

Referring to FIG. 8, in this version of the prior-art Wilkinson combiner/splitter common port 90 and uncommon ports 91-93 are connected to transmission lines 94-97, respectively, which have characteristic impedance Z ohms. Transmission lines 95-97 are connected to transmission line 94 by quarter-wavelength transmission lines 98-100, that may have a characteristic impedance of Z*sqrt(3) ohms. Transmission lines 95-97 are connected to a common node 104 through resistances 101-103, respectively. The resistances 101-103 may be Z ohms.

FIG. 9 shows an embodiment of the present design of a three-way power combiner/splitter. The embodiment of FIG. 9 is a modified Wilkinson design, where, again, the resistances called for in the prior art circuit of FIG. 8 (items 101, 102 and 103) are replaced with lumped element lossy band response circuits, comprised of components 121 through 129 shown in FIG. 9.

In the embodiment of FIG. 9, common port 110 and uncommon ports 111-113 are connected to transmission lines 114-117, respectively, which have characteristic impedance Z ohms. Transmission lines 115-117 are connected to transmission line 114 by quarter-wavelength transmission lines 118-120 that may have an impedance of Z*sqrt(3) ohms. Transmission lines 115-117 are connected to a common node 130 through lossy band response circuits. Specifically transmission lines 115-117 are connected to common node 130 by elements 121-123, 124-126, 127-129, respectively. In a 50 ohm system, capacitors 122, 125 and 128 have a reactance of approximately Z*1.3 ohms, or 66 ohms. Inductors 123, 126 and 129 may be Z*1.3 ohms, or 66 ohms. Resistances 121, 124, 127 may be slightly more (e.g. 50.3 ohms) or less (e.g. 49.4 ohms) than impedance Z ohms depending on the desired isolation.

FIG. 10 shows a graph of the combiner uncommon port to uncommon port isolation in dB from port 111 to port 112 in FIG. 9, for a 45 dB design (line 10B) as well as a 67 dB design (line 10C), both of the present invention, compared with the standard port to port isolation (line 10A) of a three-way Wilkinson combiner (prior art), between uncommon ports 91 and 92 as shown in FIG. 8. Line 10A is the uncommon port to uncommon port isolation of a standard 3 way Wilkinson power combiner (prior art) in dB (see FIG. 8). Line 10B is the uncommon port to uncommon port isolation in dB of the embodiment of FIG. 9, showing approximately 43 dB isolation over nearly a 32% bandwidth. Line 10C is the uncommon port to uncommon port isolation in dB of the embodiment of FIG. 9, showing approximately 66 dB isolation over nearly an 8% bandwidth.

In the prior art high-pass combiner of FIG. 11, common port 140 is coupled or connected to uncommon ports 141, 142 by the illustrated circuit. Port 141 is coupled to port 140 by capacitor 143 and a capacitor 144. Shunt inductor 147 connects an intermediate node between capacitors 143, 144 to ground 149. Port 142 is connected to port 140 by capacitors 145, 146. An inductor 148 connects an intermediate node between capacitors 145, 146 to ground 150. A resistor 151 connects ports 141, 142 together. In a Z=50 ohm system, Capacitors 144 and 145 may be Z*1.28 ohms or 64 ohms, reactive. Capacitors 143 and 146 may be Z*sqrt(2) ohms or 70.7 ohms, reactive. Inductors 147 and 148 may be Z*sqrt(2) ohms or 70.7 ohms, reactive. Isolation resistor 151 may be Z*2 ohms, or 100 ohms.

FIG. 12 shows an embodiment of a two-way power combiner/splitter including a solely lumped element high pass design, where, again, the resistance used in the prior art (e.g., resistor 151 of FIG. 11) is replaced with a lumped element lossy band response circuit, comprised of components 171 through 177 shown in FIG. 12.

In the embodiment of FIG. 12, common port 160 is connected to uncommon ports 161, 162 as shown in the illustrated circuit. Port 161 is connected to port 160 by capacitors 163 and 164. Shunt inductor 167 connects an intermediate node between capacitors 163, 164 to ground 169. Port 162 is connected to port 160 by capacitors 165 an 166. An inductor 168 connects an intermediate node between capacitors 165, 166 to ground 170. Ports 161, 162 are connected to one another by a lossy band response circuit including, starting from port 161, a capacitor 171, inductor 172, resistor 173, inductor 174, and capacitor 175, in parallel with an inductor 176 and a capacitor 177. In a 50 ohm system, capacitors 171 and 175 may be Z*1.67 ohms or 83 ohms, reactive. Inductors 172 and 174 may be Z*1.9 ohms, or 95 ohms, reactive. Inductor 176 may be Z*10.4 or 519 ohms reactive. Capacitor 177 may be Z*4.6 or 230 ohms reactive. The value of resistor 173 may be Z*1.88 ohms or 94.1 ohms.

FIG. 13 shows a graph of the combiner uncommon port to uncommon port isolation in dB from port 161 to port 162 in FIG. 12, for a 57 dB design (line 13B) of the present invention, compared with the standard port to port isolation (line 13A) of a two-way solely lumped element high pass combiner (prior art), between uncommon ports 141, 142 as shown in FIG. 11. Line 13A is the uncommon port to uncommon port isolation of the prior-art two-way solely lumped element high pass combiner of FIG. 11. Line 13B is the uncommon port to uncommon port isolation in dB of the embodiment of FIG. 12, showing approximately 57 dB isolation over nearly a 6% bandwidth.

In the prior-art high-pass combiner of FIG. 14, common port 180 is connected to uncommon ports 181, 182 by the illustrated circuit. Port 181 is connected to port 180 by an inductor 183. Shunt capacitor 185 connects an intermediate node between inductor 183 and port 181 to ground 188. Port 182 is connected to port 180 by inductor 184. A shunt capacitor 187 connects an intermediate node between inductor 184 and port 182 to ground 190. A shunt capacitor 186 is also connected between port 180 and ground 189. A resistor 191 connects ports 181, 182 to one another. In a 50 ohm system, capacitor 186 may be Z/sqrt(2) ohms or 35 ohms, reactive. Capacitors 185 and 187 may be Z/(2*sqrt(2)) ohms or 70.7 ohms, reactive. Inductors 183 and 184 may be Z*sqrt(2) ohms or 70.7 ohms, reactive. Isolation resistor 191 may be Z*2 ohms or 100 ohms.

FIG. 15 shows an embodiment of a two-way power combiner/splitter including a solely lumped element low pass design, often referred to as a lumped element Wilkinson design, where, again, the resistance used in the prior art (see, e.g. resistor 191, FIG. 14) is replaced with a lumped element lossy band response circuit, comprised of components 212-218 as shown in FIG. 15.

In the embodiment of FIG. 15, common port 200 is connected to uncommon ports 201, 202 as shown in the illustrated circuit. Port 201 is connected to port 200 by an inductor 204. Shunt capacitor 206 connects an intermediate node between inductor 204 and port 201 to ground 209. Port 202 is connected to port 200 by inductor 205. A shunt capacitor 208 connects an intermediate node between inductor 205 and port 202 to ground 211. A shunt capacitor 207 is also connected between port 200 and ground 210. Ports 201, 202 are connected to one another by a lossy band response circuit including, starting from port 201, a capacitor 212, inductor 213, resistor 214, inductor 215, and capacitor 216, in parallel with an inductor 217 and a capacitor 218. In a 50 ohm system, capacitors 212 and 216 may have an impedance of Z*2.3 ohms or 116 ohms, reactive. Inductors 213 and 215 may have an impedance of Z*2.5 ohms or 126 ohms, reactive. The value of resistor 214 may be Z*1.9 ohms, or 94.8 ohms. Inductor 217 may have an impedance of Z*2.1 or 104 ohms, reactive. Capacitor 218 may have an impedance of Z*1.7 or 86 ohms reactive.

FIG. 16 shows a graph of the combiner uncommon port to uncommon port isolation in dB from port 201 to port 202 for the embodiment of FIG. 15 (line 16B) compared with the standard uncommon port to port isolation of the embodiment of FIG. 14 (line 16A). Line 16A is the uncommon port to uncommon port isolation of the circuit of FIG. 14, from port 181 to 182. Line 16B is an uncommon port to uncommon port isolation in dB of the embodiment of FIG. 15 showing a high isolation design of approximately 50 dB over nearly a 6% bandwidth.

FIG. 17 shows a prior art circuit 2 way combiner known as a Gysel combiner. Port 220 is the common port and ports 221 and 222 are uncommon ports. Transmission lines 223, 224 and 225 have characteristic impedance Z, which may be 50 ohms and their length is typically electrically short. Transmission lines 226 and 227 may be Z*sqrt(2) ohm quarter wavelength transmission lines. Transmission lines 228 and 229 are Z ohm quarter wavelength transmission lines and join together at node 236 through transmission lines 230 and 231. Transmission lines 230 and 231 have impedance Z ohms and are quarter wavelength transmission lines at the center frequency of design and join together at node 236. Resistors 234 and 235 are both resistance Z ohms, and connect to transmission lines 228 and 229, and 230, 231, respectively, and grounds 232 and 233.

FIG. 18 shows an embodiment of a two-way power combiner/splitter including a Gysel design, where, again, the isolation resistances used in the prior art circuit of FIG. 17 (resistors 234 and 235) are replaced with lumped element lossy band response circuits, comprised of components 254 through 259 shown in FIG. 18.

In FIG. 18, Port 240 is the common port and ports 241 and 242 are uncommon ports. Transmission lines 243, 244 and 245 have characteristic impedance Z ohms, and their length is typically electrically short. Transmission lines 246 and 247 may be Z*sqrt(2) ohms and are a quarter wavelength at the center frequency of design. Transmission lines 248 and 249 have impedance Z ohms, and are also a quarter wavelength. Transmission lines 250 and 251 have impedance Z ohms and are a quarter wavelength and join together at node 260. In a 50 ohm system, capacitors 254 and 257 may be Z*1.1 ohms or 54.9 ohms, reactive. Inductors 256 and 259 may be Z*1.12 ohms or 55.9 ohms, reactive, or 8.9 nH. Resistors 255 and 258 may be Z*0.95 ohms, or 47.6 ohms. These values are for only one embodiment of the present design. The lossy band response circuits connect to nodes between transmission lines 248 and 249, and transmission lines 250, 251, and grounds 252 and 253 respectively.

FIG. 19 shows a graph of the combiner uncommon port to uncommon port isolation for a 36 dB implementation of the embodiment of FIG. 18 (line 19B), a 45 dB implementation of the embodiment of FIG. 18 (line 19C), and the uncommon port to port isolation of the prior-art circuit of FIG. 17 (line 19A). Line 19A is the uncommon port to uncommon port isolation of the two-way combiner splitter using the Gysel design as shown in FIG. 17, between ports 221 and 222. Line 19B is the uncommon port to uncommon port isolation in dB, between ports 241 and 242 of an implementation of the embodiment of FIG. 18 showing approximately 36 dB isolation over nearly a 22% bandwidth. Line 19C is the uncommon port to uncommon port isolation in dB, between ports 241 and 242 of another implementation of the embodiment of FIG. 18 showing approximately 45 dB isolation over nearly a 14% bandwidth.

FIG. 20 shows a 90 degree hybrid circuit of prior art. Port 270 is the common port and ports 271 and 272 are uncommon ports. Transmission lines 273, 274 and 275 have impedance Z and are typically short in electrical length. Transmission lines 276 and 277 may be Z*0.95 ohms and are one quarter wavelength at the center frequency of design. Transmission lines 278 and 279 are Z ohms and are one quarter wavelength at the center frequency of design. Resistor 281 connects from a node between transmission line 277 and transmission line 278 to ground 280 and has a value of Z ohms.

FIG. 21 shows an embodiment of a two-way power combiner/splitter including a 90 degree hybrid combiner design, where, again, the isolation resistor used in the prior art circuit of FIG. 20 (resistor 281) is replaced with a lumped element lossy band response circuit, comprised of components 302 through 304 as shown in FIG. 21.

In FIG. 21, port 290 is the common port and ports 291 and 292 are uncommon ports. Transmission lines 294, 295 and 296 have impedance Z ohms and are typically short in electrical length. Transmission lines 297 and 298 may have impedance Z*0.71 ohms and may be one quarter wavelength at the center frequency of design. Transmission lines 299 and 300 are impedance Z ohms and may be one quarter wavelength at the center frequency of design. The lossy band response circuit capacitor 302 may have a value of value of Z*3.54 ohms, the inductor 304 may have a value of Z*3.51 ohms and resistor 303 may have a value of Z*0.94, for one embodiment of the present invention. Components 302 through 304 connect between transmission lines 298 and 299, and ground 301.

FIG. 22 shows a graph of the combiner uncommon port to uncommon port isolation in dB from port 291 to port 292 in FIG. 21, for a 35 dB design (line 22B) as well as a 45 dB design (line 22C), compared with the standard port to port isolation (line 22A) of a prior-art two-way 90 degree hybrid combiner between uncommon ports 271 and 272 as shown in FIG. 20. Line 22A is the uncommon port to uncommon port isolation of the circuit of FIG. 20. Line 22B is the uncommon port to uncommon port isolation of an implementation of the embodiment of FIG. 21 showing approximately 35 dB isolation over nearly a 12% bandwidth. Line 22B is the uncommon port to uncommon port isolation of another implementation of the embodiment of FIG. 21 showing approximately 45 dB isolation over nearly a 6% bandwidth.

FIG. 23 shows a 180 degree combiner designed in the prior art. Port 310 is a common port. Ports 311 and 312 are uncommon ports. Transmission lines 313, 314 and 315 are Z ohm transmission lines and are typically electrically short. Transmission line 316 may have Z*sqrt(2) ohms impedance and is 270 degrees long at the center frequency of design. Transmission lines 317, 318 and 319 may have impedance Z*sqrt(2) ohms and each have electrical length of 90 degrees at the center frequency of design. Resistor 321 connects between transmission lines 319 and 318, and circuit ground 320, and may have a value of Z ohms.

FIG. 24 shows an embodiment of a two-way power combiner/splitter including a 180 degree hybrid design, where, again, the isolation resistance used in the prior art version of FIG. 23 (resistor 321), is replaced with a lumped element lossy band response circuit, comprised of components 341 through 343 as shown in FIG. 24.

In FIG. 24, port 330 is a common port. Ports 331 and 332 are uncommon ports. Transmission lines 333, 334 and 335 are impedance Z ohm transmission lines and are typically electrically short. Transmission line 336 may have Z*sqrt(2) ohms impedance and may be 270 degrees long at the center frequency of design. Transmission lines 337, 338 and 339 may be Z*sqrt(2) ohms and each have electrical length of 90 degrees at the center frequency of design. Resistor 342 connects between transmission lines 338 and 339, and circuit ground 340, and may have a value of Z*1.05 ohms. Capacitor 341 connects between transmission lines 338 and 339, and circuit ground 340 and may have a value of Z*1.03 ohms, reactive. Inductor 343 connects between transmission lines 338 and 339, and circuit ground 340, and may have a value of Z*1.03 ohms, reactive.

FIG. 25 shows a graph of the uncommon port to uncommon port isolation in dB from port 331 to port 332 for a 38 dB (line 25B) and 48 dB (line 25C) implementation of the embodiment of FIG. 24 compared with the standard port to port isolation (line 25A) of a prior-art two-way 180 degree hybrid combiner as shown in FIG. 23. Line 25A is the uncommon port to uncommon port isolation, between ports 311 and 312, of a standard two-way 180 degree hybrid power combiner as shown in FIG. 23. Line 25B is the uncommon port to uncommon port isolation in dB of an implementation of the embodiment of FIG. 24 showing 38 dB of isolation over nearly a 16% bandwidth. Line 25C is the uncommon port to uncommon port isolation in dB of an implementation of the embodiment of FIG. 24 showing approximately 48 dB isolation over nearly a 12% bandwidth.

FIG. 26 is a lumped element coupler as designed in the prior art. It may be used in multiple ways. However, if port 350 is used as the input port, port 351 could be the lowest loss output port. Port 352 could be the coupled port and port 353 could be the isolated port. For a coupler design that exhibits a coupled port of 20 dB, and a center frequency of 1 GHz, 50 ohms, transformers 354 and 355 could have primary inductances of 567 nH, secondary inductances of 5.8 nH and coupling K=0.99. Ground 356 is the circuit ground or return.

FIG. 27 shows an embodiment of a lumped element coupler design, where isolation resistors 367, 368 are used to provide another path to the isolation ports, that is approximately 0 degrees phase shifted and nearly the same amplitude as the signal achieved through the original circuit. If port 360 is used as the input port, port 361 could be the lowest loss output port. Port 362 could be the coupled port and port 363 could be the isolated port. For a coupler design that exhibits a coupled port of 20 dB, and a center frequency of 1 GHz, 50 ohms, transformers 364 and 365 could have primary inductances of 567 nH, secondary inductances of 5.8 nH and coupling K=0.99. Ground 366 is the circuit ground. Isolation resistors 367 and 368 could have a value of approximately 97 kOhms.

FIG. 28 shows an embodiment of a lumped element coupler design, where lossy band response circuits (items 377 through 382) are used to provide another path to the isolation ports, that is approximately 0 degrees phase shifted and nearly the same amplitude as the signal achieved through the rest of the circuit. If port 370 is used as the input port, port 371 could be the lowest loss output port. Port 372 could be the coupled port and port 373 could be the isolated port. For a coupler design that exhibits a coupled port of 20 dB, and a center frequency of 1 GHz, 50 ohms, transformers 374 and 375 may have primary inductances of 567 nH, secondary inductances of 5.8 nH and coupling K=0.99. Ground 376 is the circuit ground. Isolation resistors 378 and 381 may have a value of approximately 97 kOhms. Capacitors 377 and 380 may have a value of 0.02 pF. Inductors 379 and 382 may have inductances of approximately 11.2 mH.

FIG. 29 shows a graph (line 29B) of the isolation in dB from port 360 to port 363 for a high isolation design implementation of the embodiment of FIG. 27. FIG. 29 also shows the isolation between ports 370 and 373 of the embodiment of FIG. 28 (line 29C) compared with the standard coupler isolation (line 29A) between ports 350 and 353 for the prior-art circuit in FIG. 26. Line 29A is the uncommon port to uncommon port isolation of the standard lumped element coupler of FIG. 26. Line 29B is the uncommon port to uncommon port isolation in dB of an implementation of the embodiment of FIG. 27 showing approximately 38 dB isolation over nearly a 16% bandwidth. Line 29C is the uncommon port to uncommon port isolation in dB of an implementation of the embodiment of FIG. 28 showing approximately 48 dB isolation over nearly a 12% bandwidth.

While preferred embodiments of the present invention have been described, it is to be understood that the embodiments described are only illustrative and the scope of the invention is to be defined solely by the appended claims when accorded a full range of equivalence, many variations and modifications naturally occurring to those skilled in the art from a pursual hereof.

What is claimed is:
1. An electrical circuit comprising:
a plurality of ports, including at least one common port and two or more uncommon ports;
operational elements providing a coupling means, coupling the plurality of ports together and creating a coupling relationship among the plurality of ports at an operational bandwidth including an operational frequency;
one or more lossy band response circuits connected between one of the operational elements and at least one of a ground potential and another of the operational elements, the one or more lossy band response circuits each including one or more reactive elements and one or more resistive elements, the one or more resistive elements having resistance substantially greater than a parasitic resistance of the one or more reactive elements;
wherein the one or more lossy band response circuits provide a minimum electrical isolation between the two or more uncommon ports over an enhanced bandwidth around the operational frequency, the enhanced bandwidth being greater than a passive bandwidth of a passive electrical isolation at or below the minimum electrical isolation, the passive electrical isolation and passive bandwidth being provided by a non-reactive resistance coupled one of (a) between the two or more uncommon ports in place of the one or more lossy band response circuits and (b) between the one of the operational elements and the at least one of the ground potential and the another of the operational elements in place of the one or more lossy band response circuits.
2. The electrical circuit of claim 1, wherein the operational elements are configured as at least one of a power combiner and a splitter.
3. The electrical circuit of claim 1, wherein:
the operational elements are configured to create a first signal phase shift between the two or more uncommon ports at the operational frequency; and
the lossy band response circuit(s) creates a second signal phase shift between the two or more uncommon ports, a difference between the first signal phase shift and the second signal phase shift having a magnitude of approximately 180 degrees at the operational frequency, wherein:
the operational elements are configured to create a first signal amplitude reduction between the two or more uncommon ports at the operational frequency; and
the lossy band response circuit(s) creates a second signal amplitude reduction between the two or more uncommon ports, where the first signal amplitude reduction and the second signal amplitude reduction are approximately equal at the operational frequency.

4. The electrical circuit of claim 3, wherein the operational elements are formed by distributed elements and the lossy band response circuit is formed by lumped elements.

5. The electrical circuit of claim 4, wherein the one or more reactive components and the one or more resistive components are configured as one of a first order lossy band response circuit and a second order lossy band response circuit.

6. The electrical circuit of claim 4, wherein the lossy band response circuit is connected to the two or more uncommon ports between the two or more uncommon ports and the operational elements.

7. The electrical circuit of claim 4, wherein:
the two or more uncommon ports include at least three uncommon ports;
the lossy band response circuit is one of at least three lossy band response circuits; and
wherein each uncommon port of the at least three uncommon ports is coupled to the other ports of the at least three uncommon ports by one of the lossy band response circuit of the at least three band response circuits.

8. The electrical circuit of claim 4, wherein:
the two or more uncommon ports are at least three uncommon ports;
the lossy band response circuit is one of at least three band response circuits; and
each uncommon port of the at least three uncommon ports is connected to a common node that is not one of the at least three uncommon ports and the common port by one of the lossy band response circuits of the at least three band response circuits.

9. The electrical circuit of claim 4, wherein:
the power combiner is 90 degree-type hybrid coupler having the lossy band response circuit connected in place of a resistance thereof coupled to groundthereof.

10. The electrical circuit of claim 4, wherein:
the power combiner is a 180 degree combiner; and
the lossy band response circuit is coupled in place of a resistance between (a) a transmission line connected between one of the uncommon ports and the common port at a location between 70 and 110 degrees from each of the uncommon ports and the common port and (b) a ground potential.

11. The electrical circuit of claim 4, wherein:
the power combiner is a Gysel power combiner and the lossy band response circuit is two lossy band response circuits in place of two resistances of the Gysel power combiner.

12. The electrical circuit of claim 3, wherein the operational elements are formed by lumped elements and the lossy band response circuit is formed by lumped elements.

13. The electrical circuit of claim 12, wherein:
the operational elements define one of a lumped element high pass combiner and a lumped element low pass combiner having the lossy band response circuit in place of a resistance thereof.

14. The electrical circuit of claim 12, wherein the lossy band response circuit is connected to the two or more uncommon ports between the two or more uncommon ports and the operational elements.

* * * * *